United States Patent
Eichen et al.

(10) Patent No.: US 10,263,068 B2
(45) Date of Patent: Apr. 16, 2019

(54) FIELD EFFECT TRANSISTOR DEVICE

(71) Applicants: TECHNION RESEARCH & DEVELOPMENT FOUNDATION LIMITED, Haifa (IL); Yoav Eichen, Haifa (IL)

(72) Inventors: Yoav Eichen, Haifa (IL); Nir Tessler, Zichron Yaacov (IL); Pramod Kumar, Nesher (IL); Yulia Gerchikov, Migdal HaEmek (IL)

(73) Assignee: Technion Research & Development Foundation Limited, Haifa (IL)

( * ) Notice: Subject to any disclaimer, the term of this patent is extended or adjusted under 35 U.S.C. 154(b) by 0 days.

(21) Appl. No.: 15/561,370

(22) PCT Filed: Mar. 31, 2016

(86) PCT No.: PCT/IL2016/050341
§ 371 (c)(1),
(2) Date: Sep. 25, 2017

(87) PCT Pub. No.: WO2016/157186
PCT Pub. Date: Oct. 6, 2016

(65) Prior Publication Data
US 2018/0097057 A1   Apr. 5, 2018

(30) Foreign Application Priority Data
Apr. 2, 2015   (GB) .................................. 1505743.3

(51) Int. Cl.
*H01L 29/04*   (2006.01)
*H01L 29/49*   (2006.01)
(Continued)

(52) U.S. Cl.
CPC .......... *H01L 29/04* (2013.01); *H01L 29/4925* (2013.01); *H01L 29/7869* (2013.01);
(Continued)

(58) Field of Classification Search
CPC . H01L 29/6675; H01L 29/04; H01L 29/4925; H01L 29/78672; H01L 29/78675;
(Continued)

(56) References Cited

U.S. PATENT DOCUMENTS

| 4,726,991 A | 2/1988 | Hyatt et al. |
|---|---|---|
| 2001/0018515 A1 | 8/2001 | Kobuke et al. |

(Continued)

FOREIGN PATENT DOCUMENTS

| EP | 1498456 A1 | 1/2005 |
|---|---|---|
| WO | 2008106341 A1 | 9/2008 |

OTHER PUBLICATIONS

Schwartz, E. ""Helter-Skelter-Like" Perylene Polyisocyanopeptides" Chem. Euro. J. 15 Feb. 23, 2009 pp. 2536-2547 (Year: 2009).*

(Continued)

*Primary Examiner* — Asok K Sarkar
*Assistant Examiner* — Grant S Withers
(74) *Attorney, Agent, or Firm* — Roach Brown McCarthy & Gruber, P.C.; Kevin D. McCarthy

(57) ABSTRACT

A transistor device is described, the transistor comprising: a channel region in contact with the gate insulator and source and drain electrodes in contact with the channel region and arranged in a spaced-apart relationship. The channel region is configured with discontinuity in a material path of the channel, located between the source and drain electrodes. The channel being formed by a plurality of discrete semiconductor particles, distributed irregularly within the channel region, and a plurality of electrically conducting particles. The electrically conducting particles connect at least some of said semiconducting particles to one another to provide continuous path for electric coupling between said at least some semiconductor particles, forming an electrical path between the source and drain electrodes.

24 Claims, 13 Drawing Sheets

(51) Int. Cl.
*H01L 29/786* (2006.01)
*H01L 51/00* (2006.01)
*H01L 51/05* (2006.01)

(52) U.S. Cl.
CPC .. *H01L 29/78672* (2013.01); *H01L 29/78696* (2013.01); *H01L 51/0053* (2013.01); *H01L 51/0067* (2013.01); *H01L 51/0068* (2013.01); *H01L 51/0558* (2013.01); *H01L 2251/5369* (2013.01)

(58) Field of Classification Search
CPC ......... H01L 29/78678; H01L 29/78696; H01L 29/66568; H01L 29/66659; H01L 21/02595; H01L 27/127; H01L 27/1274; H01L 51/0508; H01L 51/0068; H01L 51/0067; H01L 51/0053
See application file for complete search history.

(56) References Cited

U.S. PATENT DOCUMENTS

| | | | |
|---|---|---|---|
| 2004/0251504 | A1 | 12/2004 | Noda |
| 2005/0104060 | A1 | 5/2005 | Halik et al. |
| 2005/0148179 | A1 | 7/2005 | Hirai et al. |
| 2009/0242855 | A1 | 10/2009 | Fleming et al. |
| 2014/0151636 | A1 | 6/2014 | Lay et al. |
| 2015/0236284 | A1* | 8/2015 | Chan ................ H01L 51/0562 365/182 |

OTHER PUBLICATIONS

Briseno, A. L. et al: Patterning Organic Single-Crystal Transistor Arrays. Nature 2006, 444, 913-917 (5 pages).
Li, H. et al: High-Mobility Field-Effect Transistors from Large-Area Solution-Grown Aligned C60 Single Crystals. J. Am. Chem. Soc. 2012, 134 (5), 2760-5. (6 pages).
Wei, Z. et al: Bridged-Grain Solid-Phase-Crystallized Polycrystalline Silicon Thin-Film Transistors. Electron Device Letters, IEEE 2012, 33 (10), 1414-1416. (3 pages).
Kumar, P.; et. al: The Relation between Molecular Packing or Morphology and Chemical Structure or Processing Conditions: The Effect on Electronic Properties. Adv. Funct. Mater. 2014, 24, 2530-2536. (7 pages).
Pribat D et al: Thin-Film Transistors and Circuits Based on Carbon Nanotubes, Journal of Display Technology, 2012, vol. 8, No. 1, pp. 54-60 (7 pages).
Hsieh G W et al: "High performance nanocomposite thin film transistors with bilayer carbon nanotube-polythiophene active channel by ink-jet printing", Journal of Applied Physics, 2009, vol. 106, No. 12 (7 pages).
Search report from a foreign patent office in a counterpart foreign application (Application No. GB1505743.3) performed Sep. 15, 2015 (1 page).
International Search Report for PCT/IL2016/050341, 5 pages, dated Jul. 18, 2016.
Written Opinion of the International Searching Authority for PCT/IL2016/050341, 4 pages, dated Jul. 18, 2016.
Communication and Supplementary European Search Report from a counterpart foreign application—EP 16 77 1537; dated Oct. 9, 2018; 2 pages.
Reza Dabirian et al: "The relationship between nanoscale architecture and charge transport in conjugated nanocrystal-bridged of multichromophoric polymers", Journal of the American Chemical Society, vol. 131, No. 20, 7055-7063; May 27, 2009—9 pages.

* cited by examiner

FIELD EFFECT TRANSISTOR DEVICE

TECHNOLOGICAL FIELD

The present invention relates to field effect transistors (FETs).

BACKGROUND ART

References considered to be relevant as background to the presently disclosed subject matter are listed below:
1. Briseno, A. L.; Mannsfeld, S. C. B.; Ling, M. M.; Liu, S.; Tseng, R. J.; Reese, C.; Roberts, M. E.; Yang, Y.; Wudl, F.; Bao, Z., Patterning Organic Single-Crystal Transistor Arrays. Nature 2006, 444, 913-917.
2. Li, H.; Tee, B. C.; Cha, J. J.; Cui, Y.; Chung, J. W.; Lee, S. Y.; Bao, Z., High-Mobility Field-Effect Transistors from Large-Area Solution-Grown Aligned C60 Single Crystals. J. Am. Chem. Soc. 2012, 134 (5), 2760-5.
3. Wei, Z.; Zhiguo, M.; Shuyun, Z.; Meng, Z.; Rongsheng, C.; Man, W.; Hoi-Sing, K., Bridged-Grain Solid-Phase-Crystallized Polycrystalline-Silicon Thin-Film Transistors. Electron Device Letters, IEEE 2012, 33 (10), 1414-1416.
4. Kumar, P.; Shivananda, K. N.; Zajączkowski, W.; Pisula, W.; Eichen, Y.; Tessler, N., The Relation between Molecular Packing or Morphology and Chemical Structure or Processing Conditions: The Effect on Electronic Properties. Adv. Funct. Mater. 2014, 24, 2530-2536.

Acknowledgement of the above references herein is not to be inferred as meaning that these are in any way relevant to the patentability of the presently disclosed subject matter.

BACKGROUND

Field effect transistor (FET) technology is based on silicon, metal oxides, or organic semiconductors, and encompasses three basic structures: a single crystal transistor, a thin film transistor, and a polycrystalline transistor. Considering the single crystal transistor in the case of silicon, millions of FETs can generally be built into a large single crystal wafer, and in the case of organic materials a large enough crystal is to be grown and accurately positioned and/or aligned to the transistor channel [1; 2]. The thin film transistor is based on amorphous semiconductors which in the case of amorphous silicon (a-Si) can be found in the backplane that drives almost every large display. In the polycrystalline FET, a thin film is composed of multiple, relatively small, crystals. In the context of silicon, these are polysilicon (poly-Si) transistors which are used in particular in recently developed organic light emitting diode (OLED) displays for hand-held applications.

Although polycrystalline based transistors, especially organic polycrystalline transistors, could have superior performance compared to amorphous ones and may be produced using low cost methods, such transistors did not find wider use. The biggest hurdle for their use is the inevitable grain boundaries that exist between crystallites. These grain boundaries are difficult to control and introduce non-uniformity in device performance over large areas.

GENERAL DESCRIPTION

There is a need in the art for a novel approach in configuring a field effect transistor (FET), in which the grain boundary resistance problem is eliminated or at least significantly reduced.

The present invention provides a novel transistor design, referred herein as "statistic field effect transistor or (SFET)", which, through a single additive step, requiring no alignment, can overcome the problems associated with the crystalline grain boundaries and the accompanying non uniformity.

It should be understood, and will be explained more specifically further below, that the novel device of the invention, SFET, is essentially different from the typical approach for transistor configuration. In the SFET of the invention, a channel region is formed by a plurality of spaced-apart and not regularly distributed semiconductor particles (e.g. a particle having semiconducting properties which may have a crystal structure) on top of gate insulator, in between source and drain electrodes, such that at least some of the semiconductor particles are electrically connected via a pattern of conducting particles (conducting islands located on the gate insulator). This non regularity may be quazi-random or random. The distribution of the semiconductor particles is referred herein as "irregular distribution" in the context that the semiconductor particles follow certain distribution, but are generally not arranged in a predetermined order. It should be understood that the conducting pattern formed by conducting particles actually provides continuous electric coupling between the at least some of the semiconductor particles. Such continuous electric coupling may be via physical connection between the semiconducting and conducting particles and/or close proximity thereof resulting in the electrical coupling.

Generally, the channel region of the SFET of the invention may be configured by a predetermined pattern of conducting particles arranged of a gate insulator between source and drain electrodes/connections. A plurality of semiconducting particles is irregularly distributed along the channel region, to provide electrical conductivity between the source and rain electrodes. As a result of the irregular distribution, a given semiconductor particle may provide electrical connection with one or two conductive particles, i.e. is being contacted on both sides with conductive particles, or with one or more other semiconductor particles connecting two conducting particles. Further, such conductive paths are statistical issues determined by density of conducting and semiconducting particles. The inventors thus call such structure as statistical field effect transistor (SFET). This statistics is dependent on the average size and density of the semiconductor particles, as well as the pattern and sizes of the conducting particles used to contact them.

The inventors have developed an exemplary SFET on a multi-crystalline (multi-particles which are crystalline) organic layer. The transistor architecture is designed to accommodate the features of "problematic" materials. The inventors have shown that such novel transistor design can overcome the grain boundary issue in the case of polycrystalline or multi-crystalline transistors.

In the context of organic semiconductors, the crystallites are often too small on the scale of low resolution fabrication methods. This has led to some efforts in positioning the crystallite at the exact right place within the channel area and often the channel length should be kept at about 10 μm. To overcome the above issues, the inventors developed a transistor structure where the fabrication of source and drain contacts and the contacting of crystallites are implemented separately.

Thus, according to one broad aspect of the invention, there is provided a transistor structure comprising: source and drain electrodes arranged in a spaced-apart relationship on top of a gate insulator layer, and a channel region on said insulator layer within the space between the source and drain, wherein the channel region is configured with discontinuity in a material path between the source and drain electrodes, the channel region being formed by a plurality of irregularly distributed discrete semiconductor particles and a plurality of electrically conducting particles connecting at least some of said semiconductor particles providing continuous electric coupling between said at least some semiconductor particles.

The plurality of electrically conducting particles may be arranged in a predetermined order within the channel region, and the plurality of semiconductor particles may be irregularly distributed within the channel region, forming a statistical electrical path between the source and drain. Properties of the formed electrical path may generally be determined in accordance with at least one of the following: distribution density of semiconductor particles, size of the semiconductor particles, arranged pattern of the conducting particles, and size of the conducting particles.

It should be understood that the above described transistor structure may actually have any one of the following configurations of the layered structure: gate, insulator, source-drain, channel; gate, insulator, channel, source-drain; channel, source-drain, insulator, gate; source-drain, channel, insulator, gate. Generally, the transistor structure may be a horizontal transistor structure where the source and drain electrodes are in the same layer and the channel region is between the source and drain electrode. The insulator may comprise a material stack, including molecular monolayers, to enhance the electronic and physical compatibility with the semiconductor.

According to another broad aspect of the invention, there is provided a field effect transistor device comprising a bottom gate top electrode transistor structure, wherein a material path between source and drain electrodes is discontinuous, a region between the source and drain electrodes being formed by a plurality of irregularly distributed discrete crystallites and a plurality of electrically conducting particles connecting at least some of the crystallites to provide continuous electric coupling between said at least some crystallites.

It should be noted that the semiconductor particles are preferably of smooth periphery. The semiconductor particles may or may not have crystal structure. Although in the description below such semiconductor particles are referred to as "crystallites", this term should be interpreted broadly as the principles of the invention for the configuration and fabrication of a SFET can be implemented using non-crystal semiconductor particles. The semiconductor particle may be amorphous, polycrystalline or mix of such morphologies and composed of conjugated molecules or conjugated polymers or metal-oxide. It should also be noted that "semiconductor particles" and "electrically conducting particles" are of different material compositions providing relatively low and high electrical conductance thereof. The semiconductor particles and the electrically conducting particles may be of any suitable shapes. In this connection, it should be noted that, although in the description below the electrically conducting particles are exemplified and at times referred to as "round particles", "circular particles", and "circles", the invention is not limited to such configuration as well as any specific geometry/shape of the electrically conducting particles. The semiconductor particles may comprise p-type or n-type materials.

Material composition for the conducting particles is selected so as to form an Ohmic contact. In some embodiments, the material composition of the particles is additionally selected to at least partially dedope the semiconducting material, and/or at least partially dope the semiconducting material, and/or, at least partially passivate the associated traps.

According to yet further broad aspect of the invention, there is provided a method for fabricating the above-described transistor device, the method comprising: providing a dielectric layer structure on top of a gate electrode; and forming on top of said dielectric layer structure source and drain electrodes located with a distance between them, a plurality of discrete semiconductor particles irregularly distributed between the source and drain electrodes, and a plurality of electrically conducting particles forming a conducting pattern connecting at least some of the semiconductor particles to one another to provide continuous electric coupling between said at least some semiconductor particles.

The electrodes, semiconductor particles and conducting particles may be sequentially formed on the dielectric layer structure (associated with a gate electrode), in any order of sequential steps.

The irregular distribution of the semiconductor particles on the dielectric layer may be provided by spin coating using a solution comprising the semiconductor particles, and annealing the spin coated film at annealing temperature close to a melting point of the film. The source and drain electrodes may be formed by evaporation of source and drain materials using a metal stencil mask having feature dimensions larger than corresponding dimensions of the crystallites. The conducting particles may be deposited by evaporation through a stencil mask. The process may utilize printing where the solution of the semiconductor particles (e.g. crystallites) material would be printed or the crystallites be transferred from crystallites source. The source and drain may be printed using, for example, nano or micro metal-particles and/or conducting (doped) material. Similar printing methods could be used for creating the pattern of conducting particles.

For example, the majority of semiconductor particles (crystallites) may be configured as elongated semiconductor particles. The semiconductor particles may have a length of 5-15 μm and a width of 1-15 μm. The dimensions of the semiconducting and of the conducting particles and gap between them may be controlled/selected. For example, the majority of the conducting particles may have a size of 10-30 μm and may be arranged with a gap of 3-8 μm between them. Generally, the conducting pattern formed by the electrically conducting particles may act to reduce the effective length of the channel. Indeed, when the size to gap ratio increases, the area covered by metal increases and the length the charges have to be transported in the semiconductor decreases.

Thus, according to a broad aspect of the present invention, there is provided a transistor device comprising: a channel region in contact with the gate insulator and source and drain electrodes being in contact with the channel region and arranged in a spaced-apart relationship, wherein the channel region is configured with discontinuity in a material path between the source and drain electrodes, the channel region being formed by a plurality of irregularly distributed discrete semiconducting particles and a plurality of electrically conducting particles connecting at least some of said semiconducting particles to one another to provide continuous electric coupling between said at least some semiconductor particles. The semiconductor particles may comprise p-type or n-type materials. The semiconducting particles may also comprise crystallites. The crystallites may include p-type or n-type single crystals and/or polycrystalline grains.

According to some embodiments, said plurality of electrically conducting particles may be arranged in a predetermined pattern within the channel region. The predetermined pattern of the electrically conducting particles may provide that a distance between two adjacent conducting particles is smaller than a typical dimension of said conducting particles.

According to some embodiments, said plurality of semiconducting particles may be distributed within the channel region such that the semiconductor particles are spaced apart from each other.

According to some embodiments, the channel region may comprise a continuous film being at least a portion of said channel and providing a continuous path for electrical conduction along at least a portion of the channel region.

Generally, a majority of the semiconductor particles may be of length to width ratio of between 1 and 15. Additionally or alternatively, a majority of said semiconductor particles may be of length of 5-15 µm and width of 1-15 µm. A majority of said electrically conducting particles may have typical dimension of between 10 µm and 30 µm. Further, the electrically conducting particles may be arranged with distances of between 3 µm and 8 µm between them.

According to some embodiments, material composition of the electrically conducting particles may be selected to form Ohmic contact.

According to another broad aspect of the invention, there is provided a field effect transistor device comprising a bottom gate top electrode transistor structure, wherein a material path between source and drain electrodes is discontinuous, a region between the source and drain electrodes being formed by a plurality of randomly distributed discrete crystallites and a plurality of electrically conducting particles connecting at least some of the crystallites to provide continuous electric coupling between said at least some semiconductor particles. The crystallites may include p-type or n-type single crystals.

Generally, a majority of said crystallites may have length of 5-15 µm and width of 1-15 µm. Additionally or alternatively, a majority of said electrically conducting particles may have a size of 10-30 µm and a gap between them of 3-8 µm.

According to some embodiments, material composition of the electrically conducting particles may be selected to form Ohmic contact. Such material composition may be selected to at least partially, dedope a semiconducting material of the semiconducting particles. Alternatively or additionally, the material composition may be selected to at least partially dope a semiconducting material of the semiconducting particles.

According to yet another broad aspect of the invention, there is provided a method for fabricating a transistor device, the method comprising:
 providing a dielectric layer structure on top of a gate electrode;
 forming on top of said dielectric layer structure the following: source and drain electrodes located with a distance between them, a plurality of discrete semiconducting particles irregularly distributed between the source and drain electrodes, and a plurality of electrically conducting particles between the source and drain electrodes forming a conducting pattern connecting at least some of the semiconducting particles to one another to thereby provide continuous electric coupling between said at least some semiconductor particles.

According to some embodiments, said semiconducting particles may comprise crystallites.

The formation of said source and drain electrodes, the plurality of discrete semiconducting particles, and the plurality of electrically conducting particles may be sequentially performed, in any order of sequential steps.

According to some embodiments, the irregularly distributed semiconducting particles may be provided on said dielectric layer by spin coating of a solution comprising the semiconducting particles thereby forming a film, annealing the spin coated film at annealing temperature close to a melting point of the film.

According to some embodiments, the formation of the source and drain electrodes may comprise evaporation of source and drain materials using a metal stencil mask having feature dimensions larger than corresponding dimensions of the semiconducting particles.

According to some embodiments, the electrically conducting particles may be deposited on top of said dielectric layer in a predetermined pattern. The electrically conducting particles may be deposited by evaporation through a stencil mask.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 5E-5H show AFM images of the experimental data for the developed random distribution of single crystals on $SiO_2$ substrates, where FIGS. 5C and 5E show the 100×100 µm AFM images of p-type and n-type single crystals, respectively, developed using spin coating of 0.5 mg/mL and 2 mg/mL, and FIGS. 5D and 5F show the same for a higher concentration solutions of 1 mg/mL and 4 mg/mL, respectively;

FIGS. 6A and 6C show the output characteristics for, respectively, p-type OSFET and n-type OSFET, for different gate voltages; FIGS. 6B and 6D show the transfer characteristics for, respectively, p-type OSFET and n-type OSFET; FIG. 6E shows the output characteristics of p-type OSFETs prepared using different solution concentrations; and FIG. 6F shows the transfer characteristics of n-type OSFETs prepared using OTS coated $SiO_2$;

FIG. 7A shows the charge density at the transistor channel (insulator interface); FIG. 7B shows the 2D charge density distributions; and FIG. 7C shows the 2D distribution of the current flowing parallel to the insulator film between the source and drain electrodes.

DETAILED DESCRIPTION OF EMBODIMENTS

The present invention provides a novel statistic field effect transistor (SFET) structure, in which a channel region is formed by a plurality of irregularly distributed (e.g. randomly distributed) discrete semiconductor particles and a plurality of electrically conducting particles statistically connecting at least some of the semiconductor particles to provide a continuous electric coupling between at least some of the semiconductor particles.

The inventors have shown an exemplary transistor based on ~10 μm size single crystals having a 100 μm channel length. The inventors have chosen this case to demonstrate the concept of SFET. In this connection, it should be noted that other cases, where the crystallites grow closer or touch each other, can be more trivially adapted to this design.

Reference is made to FIGS. 1A-1C, 2A-2C, 3A-3C and 4A-4C illustrating the principles of the SFET of the invention, and four examples of its fabrication.

Figure 1A:
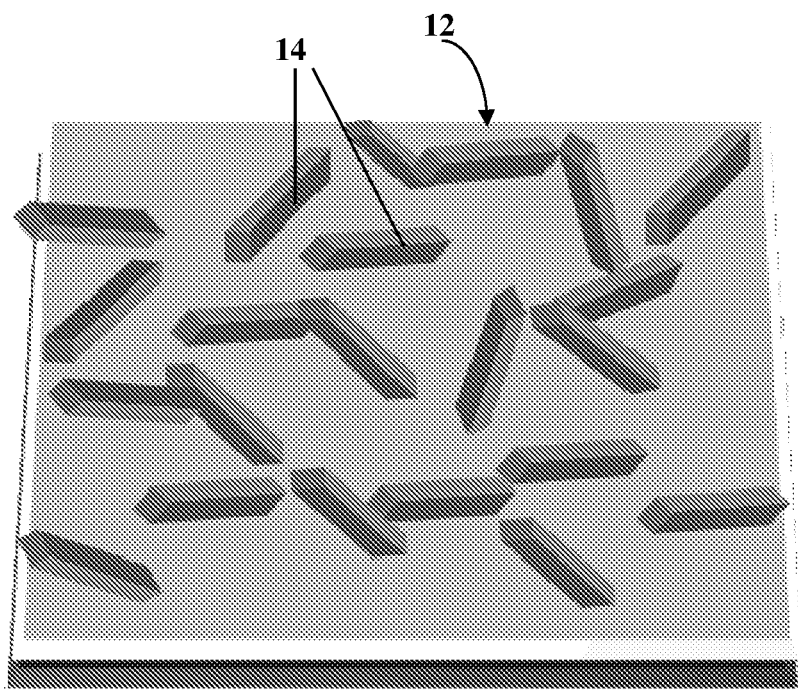
FIGS. 1A-1C, 2A-2C, 3A-3C and 4A-4C schematically illustrate the principles of the SFET device of the invention and examples of its fabrication.
Figure 1B:
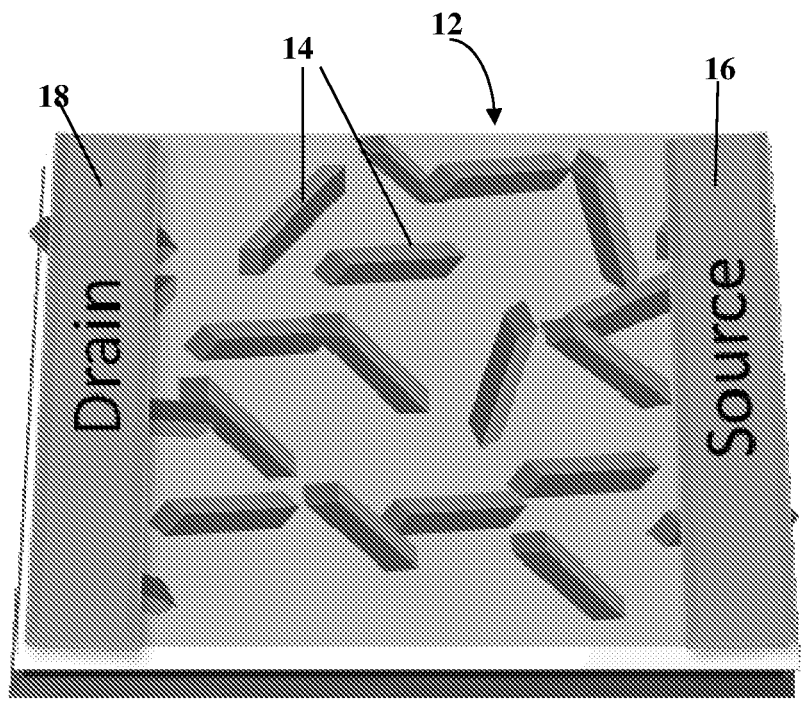
Figure 1C:
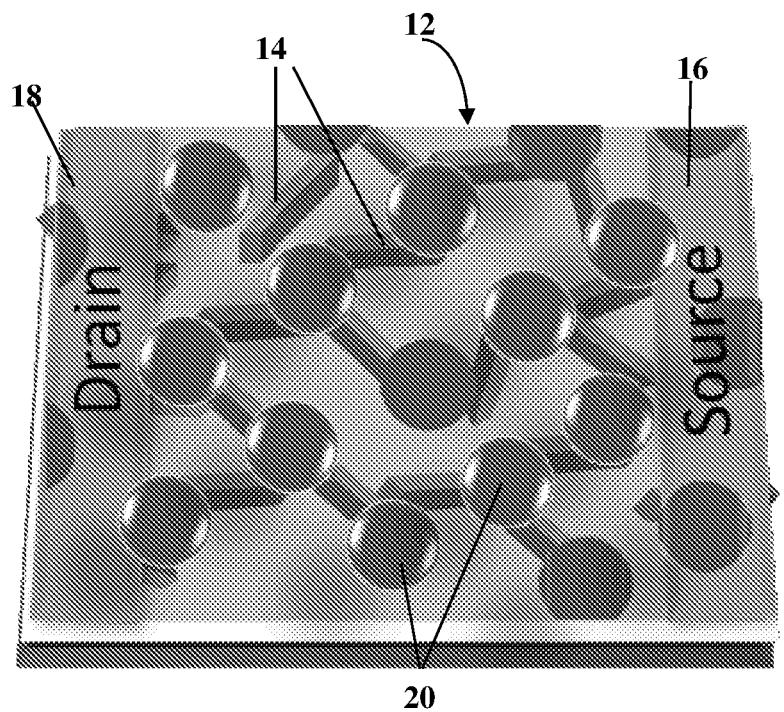

Here, FIG. 1C schematically illustrates an SFET 10 including a gate-with-dielectric structure 12, source and drain electrodes 16 and 18, semiconductor particles 14 distributed within the channel region substantially in a spaced-apart manner (i.e. discrete semiconductor particles, disconnected from one another), and conducting particles 20 forming a conducting pattern providing connection between the semiconductor particles 14. The conducting pattern formed by particles 20 actually provides continuous electric coupling between at least some of the semiconductor particles 14 thereby forming an electrical path between the source 16 and drain 18 electrodes. Such continuous electric coupling may be via physical connection between the particles 14 and 20 forming the pattern and/or close proximity resulting in the electrical coupling. The dimensions and density of the semiconductor particles, as well as the dimensions of the conducting particles and gap between them, may be properly selected to provide the desired characteristics of the SFET.

Due to the irregular distribution of the semiconductor particles 14, the resulting distribution may or may not include semiconductor particles 14 in physical contact between them. However, to provide statistical conductivity, the density of distribution and size of the semiconductor particles 14, is preferably selected to reduce physical contact between them.

For example, the majority of semiconductor particles (crystallites) 14 may have a length of 5-15 μm and a width of 1-15 μm. The majority of the conducting particles 20 may have a size of 10-30 μm and may be arranged with a gap between them of 3-8 μm. Increasing the size to gap ratio of the conductive pattern may properly reduce the effective length of the channel.

FIGS. 1A-1C show an example of fabrication of the SFET 10. As shown in FIGS. 1A and 1B, the structure 12 of gate electrode covered by dielectric is prepared, on which crystallites 14 (constituting semiconductor particles) are randomly (irregularly) grown/distributed, and on which source and drain electrodes 16 and 18 are deposited. This results in a so-called bottom gate top electrode transistor structure. The crystallites 14 are grown at a density such that most of them are apart. It should be noted that since the crystallites 14 are well apart, there is no continuous path between the electrodes, and hence this is actually not a transistor at all. As further shown in FIG. 1C, the SFET 10 can be configured following an additive step of depositing the conducting pattern 20. Thus, with one additive step that deposits conducting particles 20, over the entire area, the crystallites 14 become connected, and the SFET 10 is now actually composed of many transistors connected in series and in parallel. A commercially available stencil mask was used to deposit the conducting circles 20.

Figure 2A:
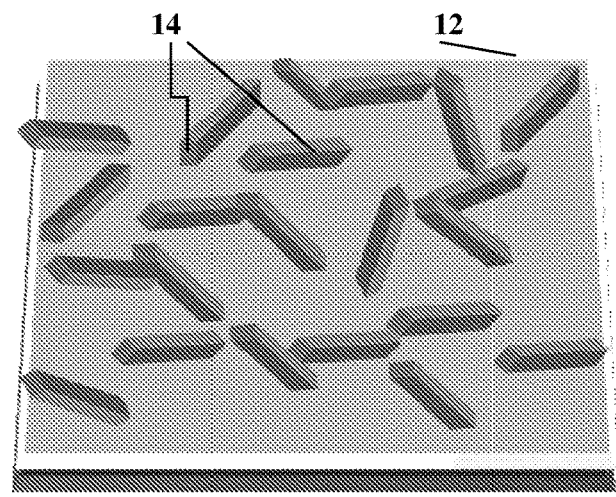
Figure 2B:
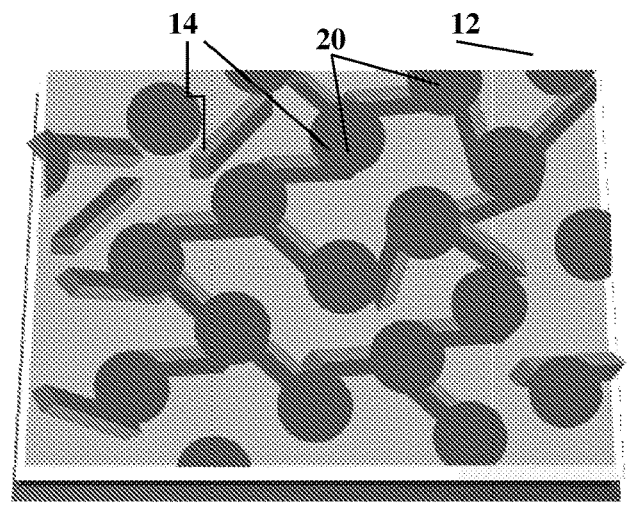
Figure 2C:
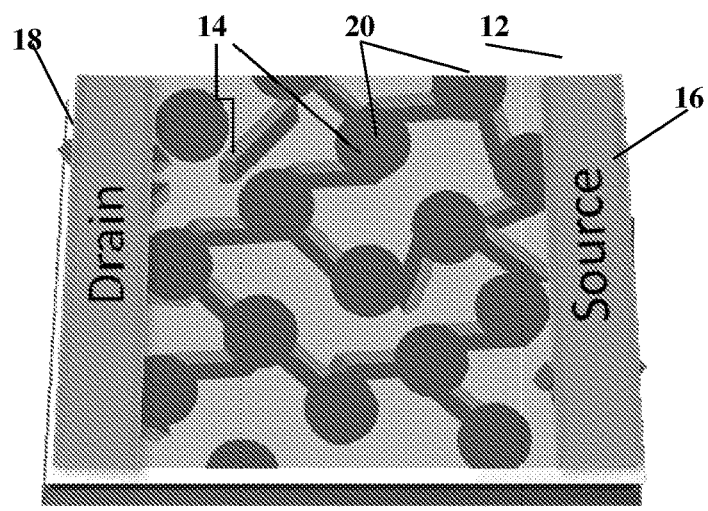

FIGS. 2A-2C show another example of fabrication of SFET 10 of the invention. In this example, similar to the previous one, first the structure 12 of gate electrode covered by dielectric is prepared (FIG. 2A). Then, the crystallites 14 and the particles 20 are sequentially formed on top of structure 12 (FIGS. 2A and 2B), by deposition, e.g. printing, and then electrodes 16 and 18 are formed by any suitable technique (FIG. 2C).

Figure 3A:
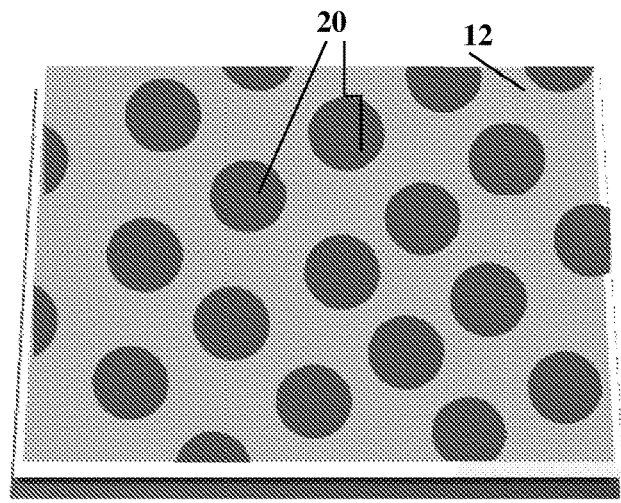
Figure 3B:
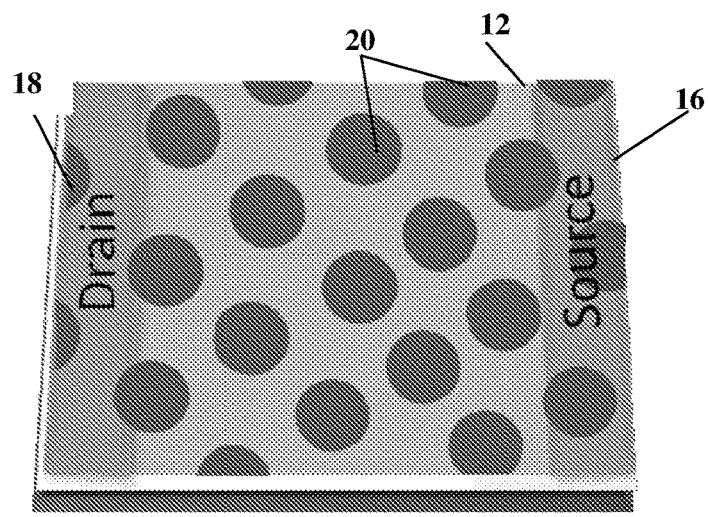
Figure 3C:
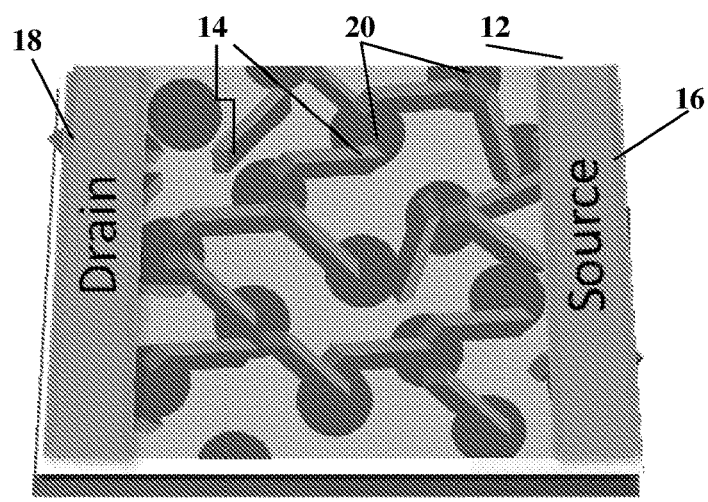

In the example of FIGS. 3A-3C, the elements of the SFET device are formed on the gate-with-dielectric structure 12 in a further different order. The conducting pattern of particles 20 is created on top of structure 12 (FIG. 3A), then electrodes 16 and 18 are formed (FIG. 3B), and thereafter crystallites 14 are deposited in the irregular distribution (FIG. 3C).

Figure 4A:
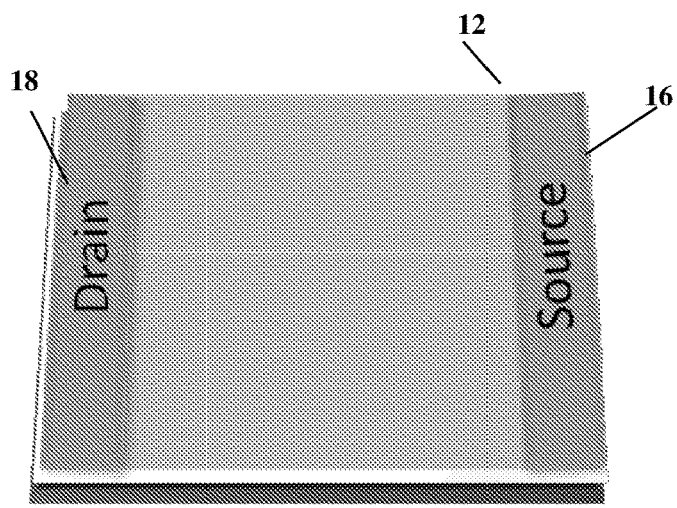
Figure 4B:
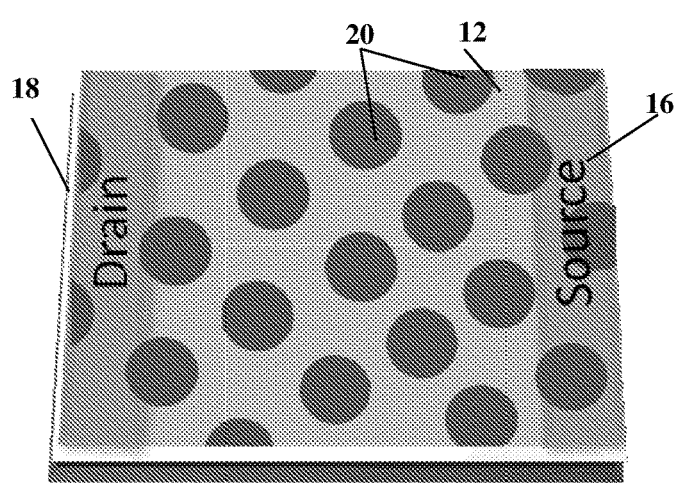
Figure 4C:
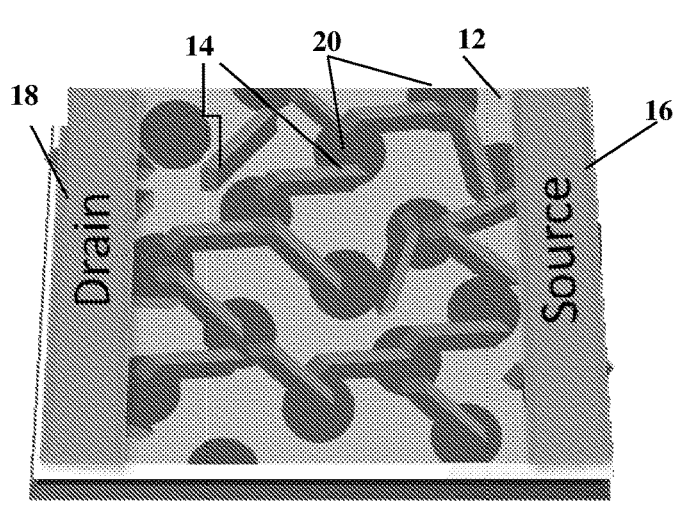

In the example of FIGS. 4A-4C, electrodes 16 and 18 are first formed on top of gate-with-dielectric structure 12 (FIG. 4A), and then the particles 20 and crystallites 14 are sequentially deposited (FIGS. 4B and 4C).

The probability that a given crystallite is being contacted on both sides and the number of crystallites connecting two conducting particles 20 are statistical issues, and therefore the inventors call such structure 10 as statistical field effect transistor (SFET). This statistics is dependent on the average size and density of the crystallites 14, as well as the pattern of particles 20 used to contact them.

Figure 1D:
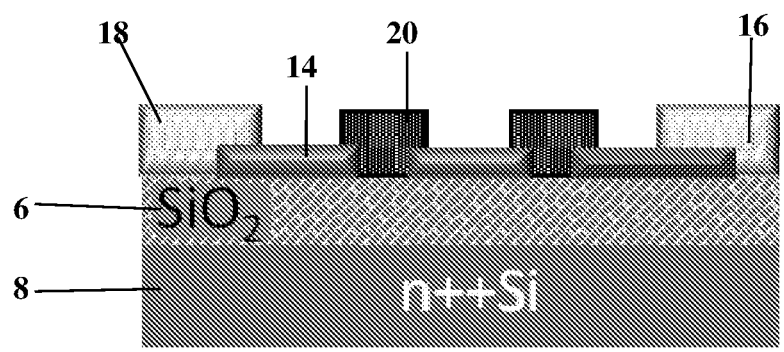
FIGS. 1D and 1E show schematically side and top views of the SFET device of FIG. 1C illustrating the conducting circles forming a continuous path between the source and drain electrodes.
Figure 1E:
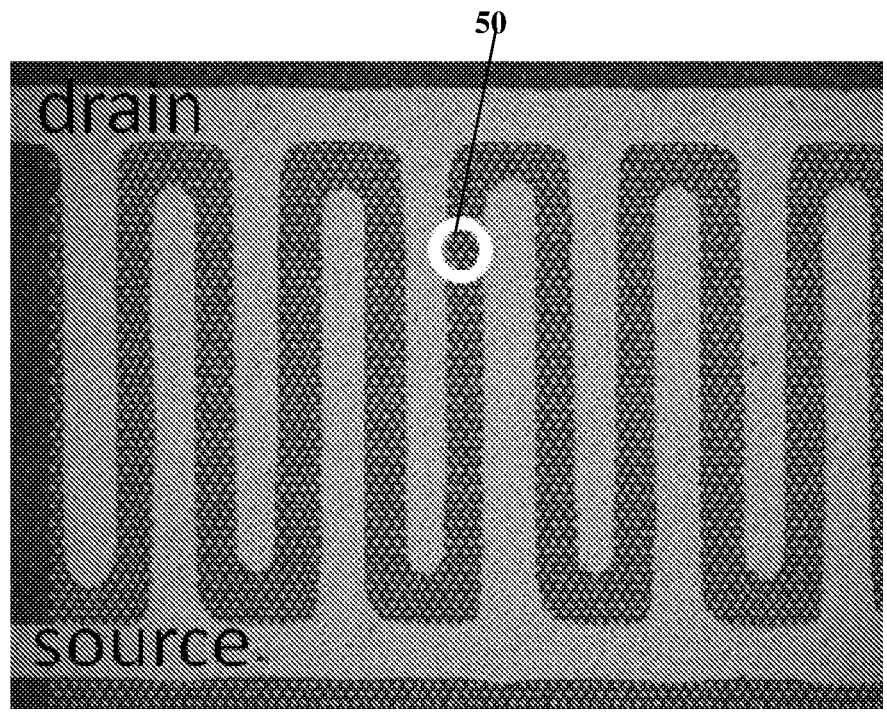
Figure 1F:
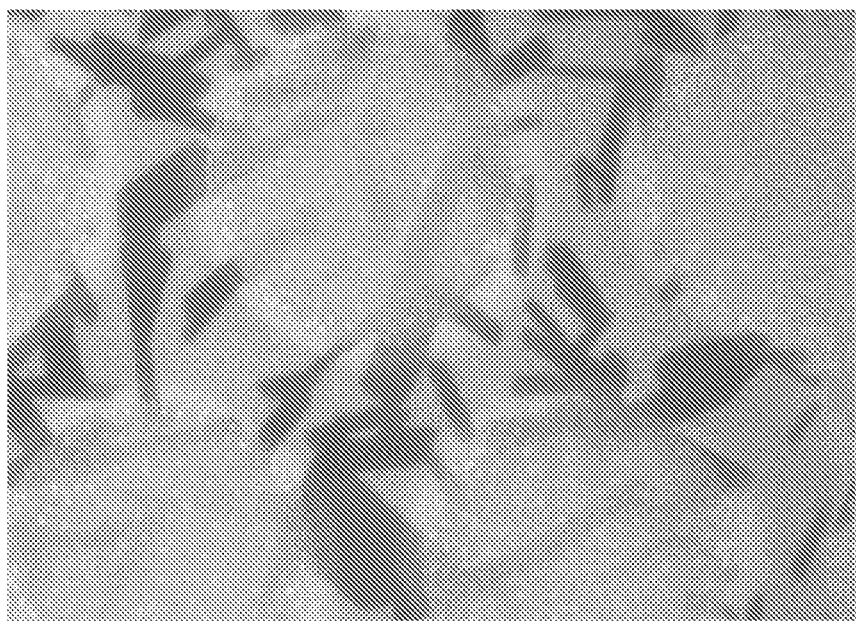
FIG. 1F shows a SEM image of the SFET zooming on a channel region.

FIG. 1D shows schematically a side view of the SFET 10 illustrating how the conducting particles (20 in FIG. 1C) form the continuous path between the two electrodes 16 and 18 via semiconductor particles 14. Also shown in FIG. 1D is a gate electrode 8 and gate insulator 6. FIG. 1E shows a top view image of an exemplary configuration of the SFET 10 illustrating mainly the interpenetrating source and drain electrodes (gold) along with the conducting pattern that was deposited across. It should be noted that across the entire field of view there is a pattern of conducting circles that was deposited without any alignment whatsoever. FIG. 1F is scanning electron microscope (SEM) image zooming on a channel region, marked 50 in FIG. 1E. This image shows circular particles 20 which form the conducting pattern, and across them there are darker elongated shapes (the crystallites 14) that are being contacted by the circular conducting pattern.

Figure 5A:
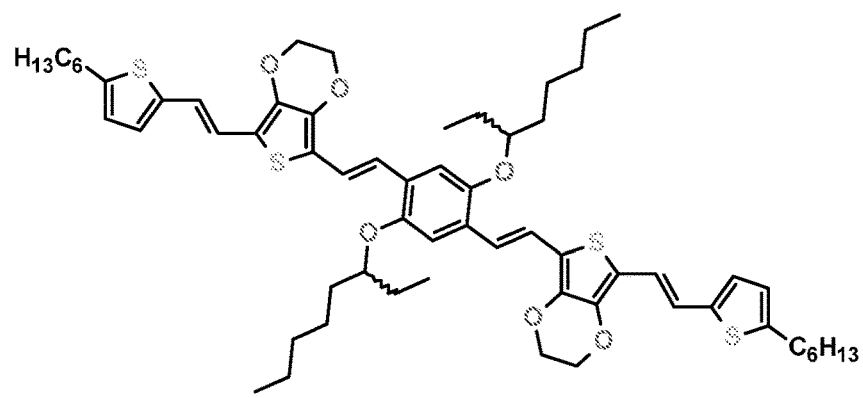
Figure 5B:
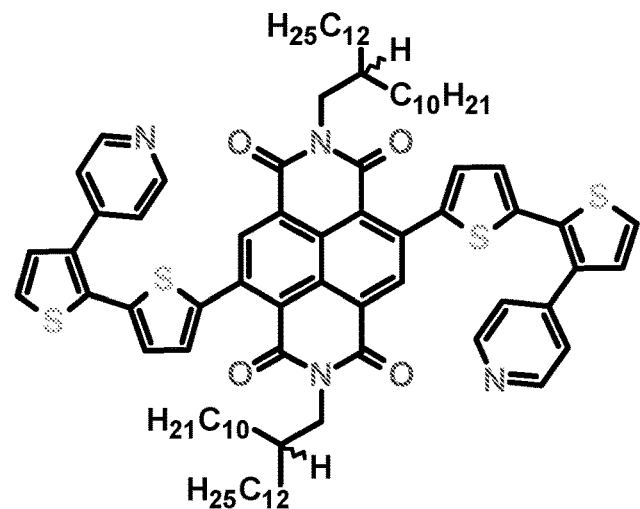

To demonstrate the operation of the above-described SFET 10, the inventors used both p-type and n-type crystal (crystallites') forming molecules. In this connection, reference is made to FIGS. 5A and 5B showing the chemical structures of the molecules for the p-type and n-type crystals, respectively.

Details of the p-type molecule and the dependence of its film morphology on the processing conditions are known [4]. Somewhat similar behavior was found for the n-type molecule. The recent study of the evolution of p-type micro-sized crystals on silicon oxide, described in this publication, has shown that it is possible to grow crystals of different sizes and density by annealing a spin coated film at temperatures close to its melting point. In this study, p-type and n-type molecules were spin coated from tetrahydrofuran (THF) solution onto silicon oxide substrates to form a film and then kept for 3 hours in a vacuum oven at 150° C. and 120° C., respectively. The driving force for the molecules to self-arrange into crystals was the temperature that increased the surface mobility of the molecules allowing them to form crystalline domains. This is a non-equilibrium kinetic process, and hence, the final macroscopic state of the system depends on the route taken through the various reaction paths.

Figure 5C:
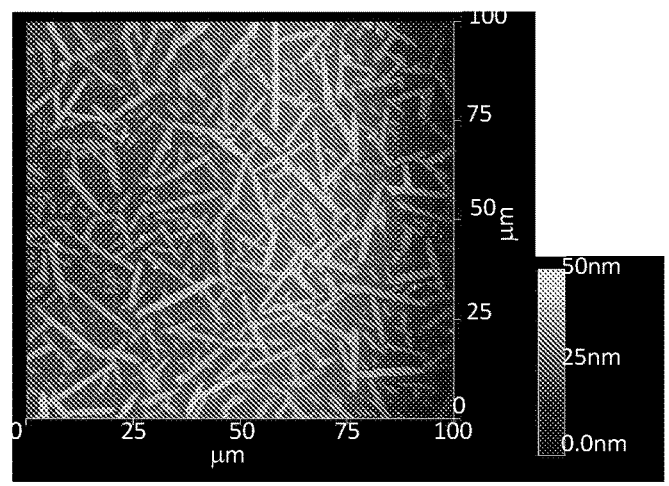
Figure 5D:
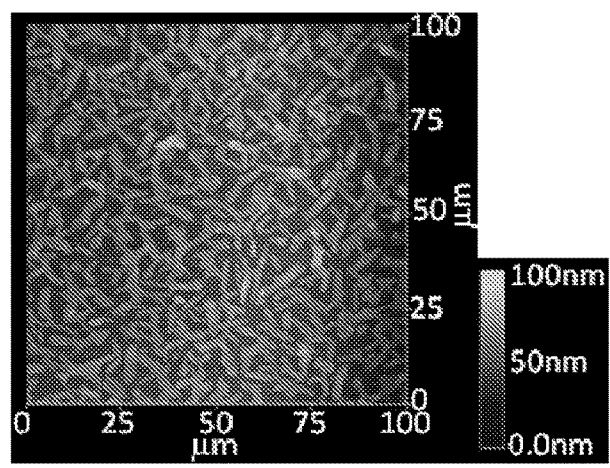
Figure 5E:
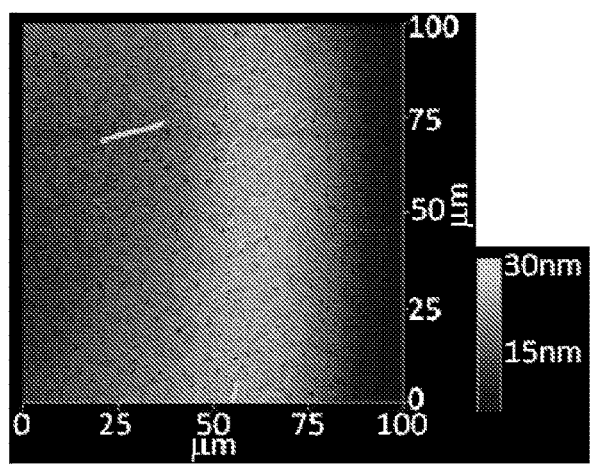
Figure 5F:
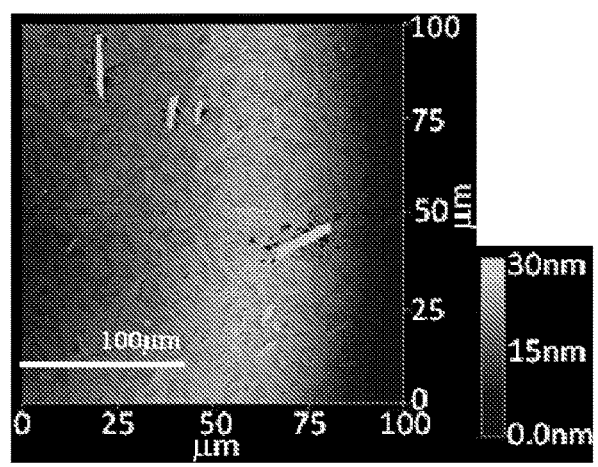
Figure 5H:
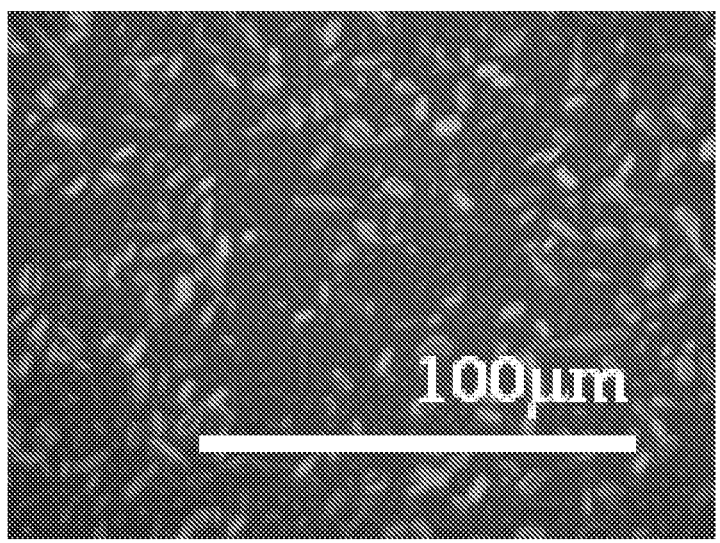

FIGS. 5C-5H show AFM images of the developed random distribution of single crystals on SiO$_2$ substrates. More specifically, FIGS. 5C and 5E show the 100×100 µm AFM images of p-type and n-type single crystals, respectively, developed by spin coating of 0.5 mg/mL and 2 mg/mL, respectively, followed by annealing at 150° C. and 120° C., and FIGS. 5D and 5F show the same but for a higher concentration solutions of 1 mg/mL and 4 mg/mL, respectively where FIG. 5H shows an enlarged image of a portion of the channel region, illustrating disordered arrangement of the semiconducting crystallites.

The AFM pictures of the p-type molecule show randomly oriented, and generally isolated, crystals. Also shown is the effect of varying the solution concentration on the crystals size and density. At the lower concentration (FIG. 5C) longer and thinner crystals were developed, and at the higher concentration (FIG. 5D) a higher crystal's density is observed. FIGS. 5E and 5H show pictures of patchy films that indicate a largely different morphology. Unlike the p-type molecule, the crystalline domains of the n-type molecule grow rather thin and flat, and are largely interconnected. Compared to the p-type molecule crystalline morphology, the one of the n-type is closer to polycrystalline structures such as polysilicon.

The inventors have thus shown that coating the silicon oxide surface with octadecyltrichlorosilane (OTS) promotes morphology that is more similar to that of the p-type molecule. The optical picture, shown in FIG. 5H, shows a clear image of randomly oriented crystals indicating the importance of the surface energy in the crystallization process.

The results shown in FIGS. 5A-5F relate to the first step (FIG. 1A) in the SFET fabrication process. Following the concept described in FIGS. 1A-1C for the SFET configuration and fabrication, the inventors have fabricated a series of such transistors. The fabrication of SFETs were carried out following three simple steps: 1) Fabrication of randomly distributed crystallite on substrate by annealing the spin coated films at temperatures close to their melting point; 2) Evaporation of gold source-drain contacts using a commercially available metal stencil mask having dimensions (length and width) larger than the crystal sizes (L=100 µm, W=19800 µm); 3) Evaporation through a silicon stencil mask to create the circular gold pattern over the entire area of the interdigitated source-drain electrodes. The results of having the crystals interconnected are exemplified above (e.g. FIGS. 1C and 1F).

Figure 6A:
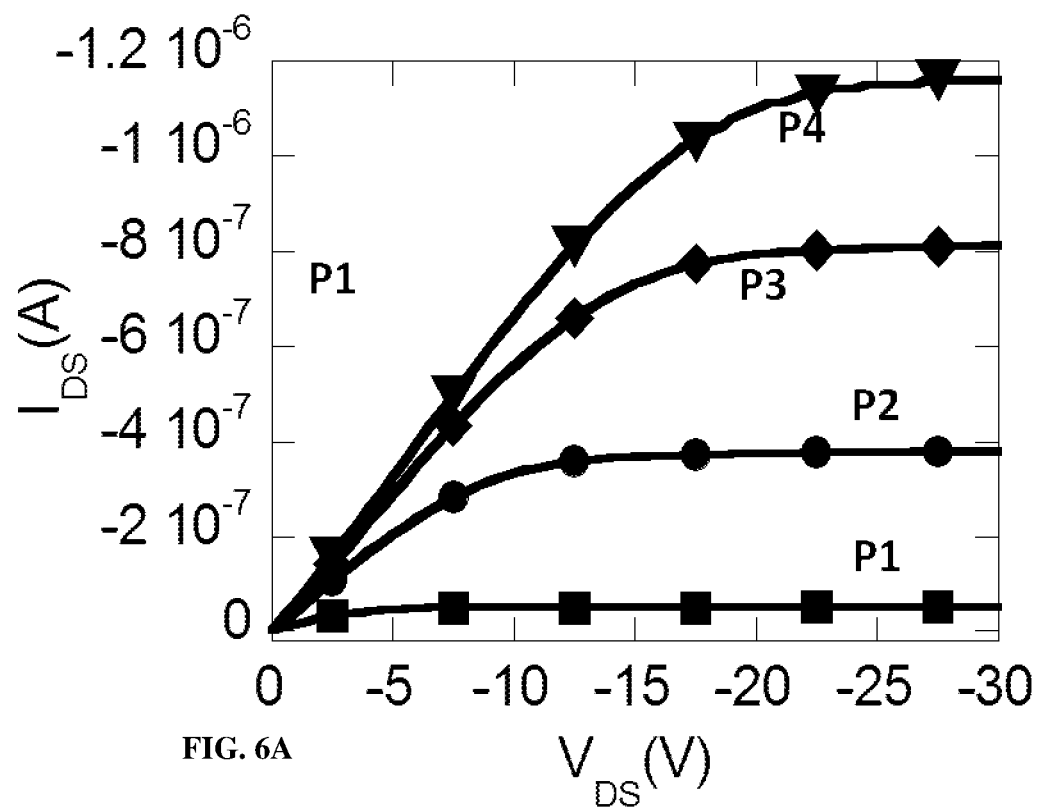
FIGS. 6A to 6F show the experimental results for the output and transfer characteristics of organic single crystallite SFETs (OSFETs) configured according to the present invention, where
Figure 6B:
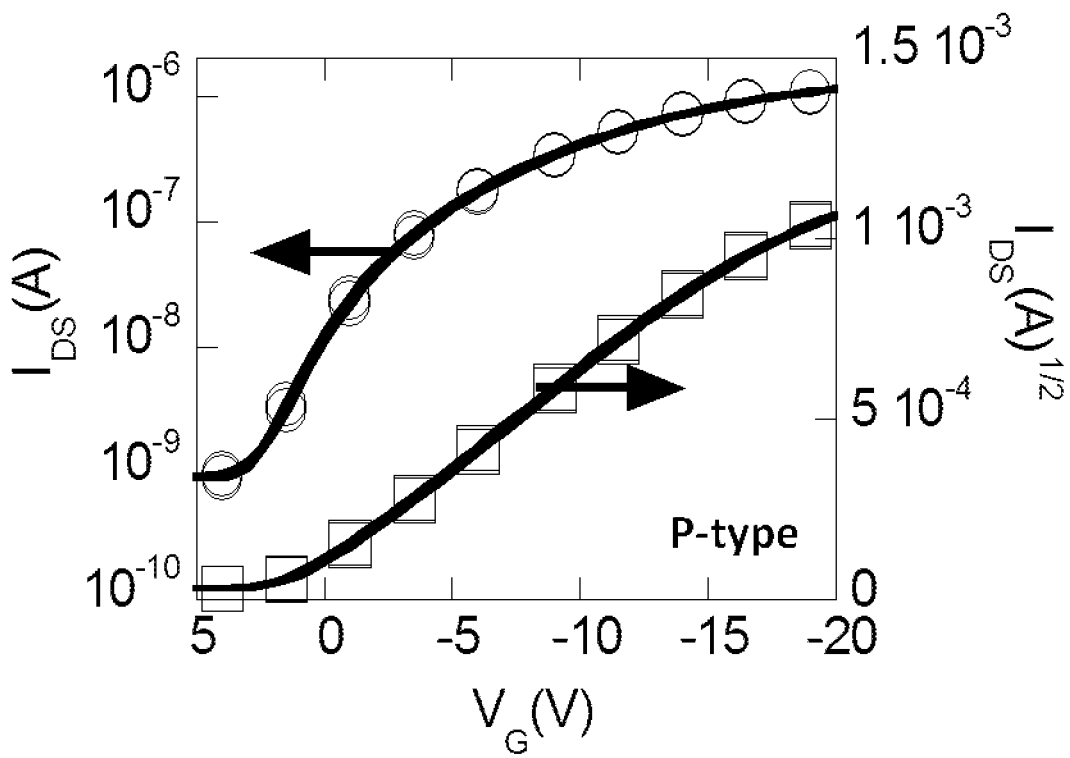
Figure 6C:
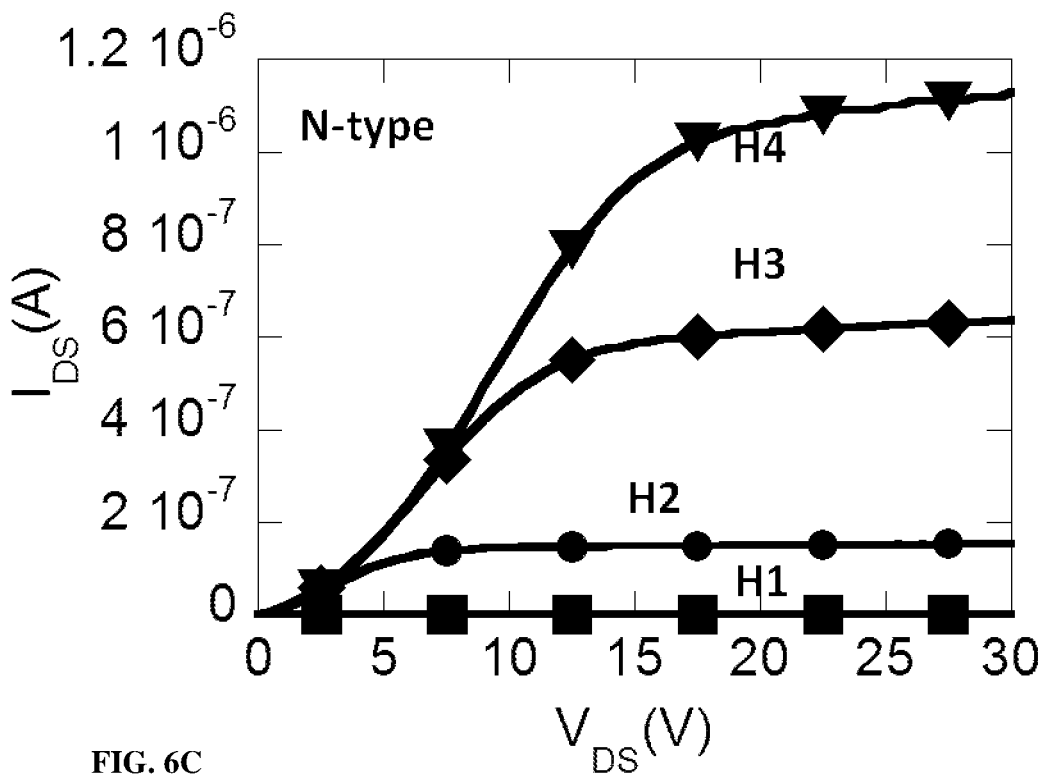
Figure 6D:
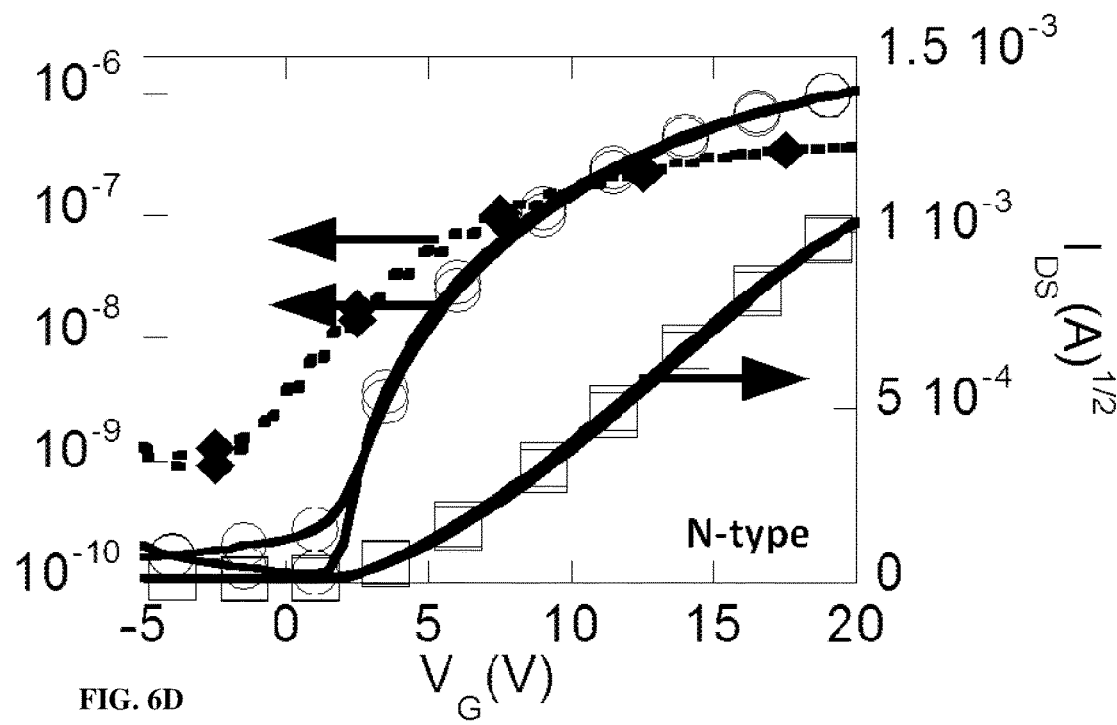
Figure 6E:
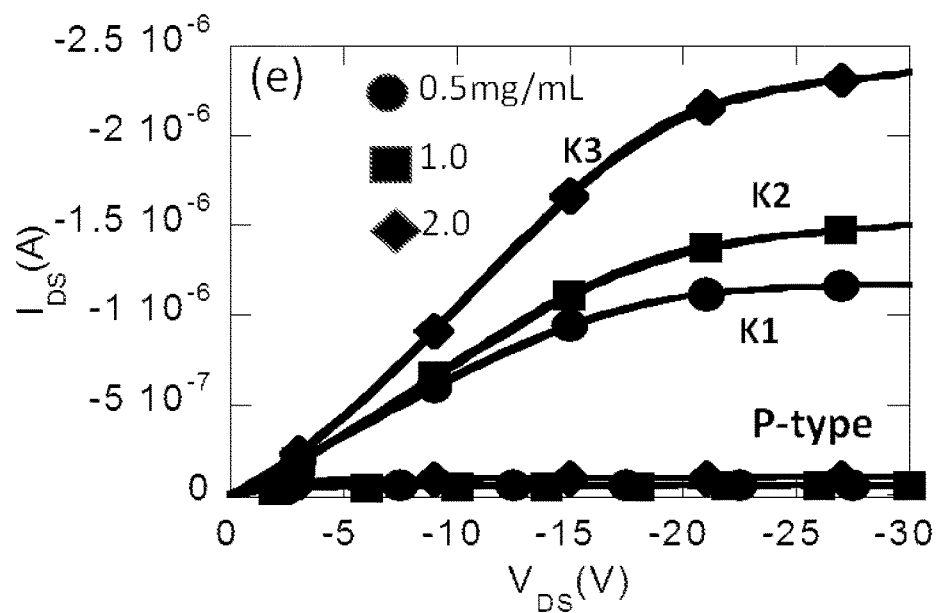
Figure 6F:
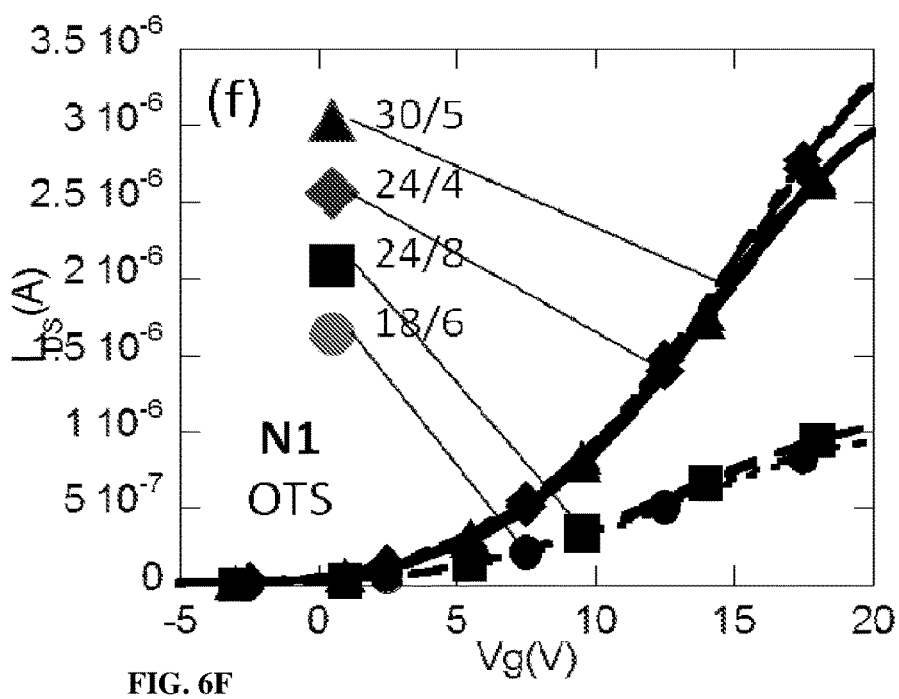

Reference is made to FIGS. 6A to 6F showing the output and transfer characteristics of organic single crystallite SFETs (OSFETs) of the present invention. More specifically, FIGS. 6A and 6C show the output characteristics, i.e. the source drain current $I_{DS}$ versus the source drain voltage $V_{DS}$, for respectively p-type OSFET and the gate voltages of $V_G$=−2, −10, −16, −20V (curves $P_1$-$P_4$ respectively), and n-type OSFET and the gate voltages of $V_G$=2, 10, 16, 20V (curves $H_1$-$H_4$ respectively). The full curves in FIGS. 6B and 6D correspond to the transfer characteristics for, respectively, p-type OSFET at $V_{DS}$=−15V and n-type OSFET at $V_{DS}$=15V. The circles show the current ($I_{DS}$) and the squares show the square root of it ($I_{DS}^{0.5}$). The layout parameters are as follows: the length and width of the channel are L=100 µm and W=19800 µm; the circular pattern parameters include the particle's size of 24 µm and a gap between the particles of 8 µm. The dotted curve in FIG. 6D corresponds to the transfer characteristics ($I_{DS}$) of the structure prior to deposition of the circular pattern thereon. FIG. 6E shows the output characteristics of p-type OSFETs prepared using different solution concentrations for $V_G$=−2V and −20V. Curves $K_1$, $K_2$ and $K_3$ correspond to 0.5 mg/ml, 1 mg/ml, and 2 mg/mL, respectively. FIG. 6F shows the transfer characteristics of n-type OSFETs prepared using OTS coated SiO$_2$. The data is for OSFETs with the conducting pattern having a size to gap ratio of 3 (24/8, 18/6) and 6 (30/5, 24/4). The initial films for the p-type having characteristics of FIGS. 6A and 6B were spin casted from 1 mg/mL, and for n-type having characteristics of FIG. 6C—from 4 mg/mL. For n-type on OTS (FIG. 6F), 10 mg/mL were used.

In FIGS. 6A and 6B, showing the p-type SFET output and transfer characteristics, respectively, each curve is a double scan in both directions showing negligible hysteresis effect. Also, FIG. 6B shows that the threshold voltage is very close to zero. Prior to the deposition of the circular pattern (using a stencils mask), the transistors showed negligible, if at all, electric current. The stencils mask pattern interconnects the randomly distributed single crystals, and the source-drain current ($I_{DS}$) depends on the mobility of the single crystals and a number of complete paths from the source to drain. As the circular pattern is of gold, which forms close to ohmic contact with the p-type molecule, the crystals between source-drain contacts virtually act like a single crystal.

In order to verify this, it should be taken into account that only part of the area (width W and length L) defined by the source and drain electrodes is covered by crystals. The inventors used AFM images to estimate the fill factor or the density (number) of crystals that are interconnected, which allowed to estimate the mobility value of 0.05-0.08 cm$^2$/Vs. This is very close to the average value for a single crystal of 0.1 cm$^2$/Vs, as recently reported [4].

FIG. 6E shows the output characteristics of p-type OSFETs prepared using different solution concentrations. Since the crystals' density increases with the solution concentration, so would the fill factor of the channel and hence the electric current through the device.

The n-type molecule is different in two major points: (1) it forms interconnected crystalline domains, and (2) its energy levels are different making gold a non-ohmic contact. Indeed, FIG. 6C shows that the linear regime has a diode like shape indicating a contact barrier. The inventors used a drain source voltage that is large enough to overcome the contact resistance, and received close to ideal transfer characteristics, shown by full curves in FIG. 6D.

The transfer characteristics of the transistor, prior to the deposition of the circular gold pattern, as shown by the dotted curve in FIG. 6D, clarifies relation between a Schottky barrier formed by gold and the circular pattern. As the morphology is defined by interconnected polycrystalline domains, a significant electric current would flow in the standard FET configuration. The striking difference is that upon deposition of the circular pattern the off current was reduced by an order of magnitude and the threshold voltage shifted towards zero. Both of these effects provide indication of dedoping (reduction in doping or in dopant concentration) which can be attributed to the depletion formed by the Schottky contacts with the circular pattern.

The last attribute of the circular pattern is shown in FIG. 6F. Here, the inventors used OTS coated SiO$_2$ and a high solution concentration, 10 mg/mL, of the n-type molecule so as to arrive at a relatively high density of single crystals (see FIG. 6F for the effect of OTS on the crystalline morphology). The data corresponds to the results with respect to four OSFETs with pattern structure of (size, gap) being: (18,6), (24,8), (24,4), (30,5). The results show that the circular pattern may also act to reduce the effective length of the channel. When the size to gap ratio increases, the area covered by the metal increases and the length the charges have to be transported in the semiconductor decreases. It should be noted that upon increasing the ratio from 3 to 6, the current increases by a factor of 3 which is slightly larger than the geometrical factor.

The SFET structure of the invention affects the apparent material properties. To show this, the inventors have performed 2D simulation of such a structure. In this connection, reference is made to FIGS. 7A-7C showing the results of a 2D drift-diffusion-Poisson simulation of a structure of the type shown in FIG. 1D and for $V_{GS}=V_{DS}=10V$.

Figure 7A:
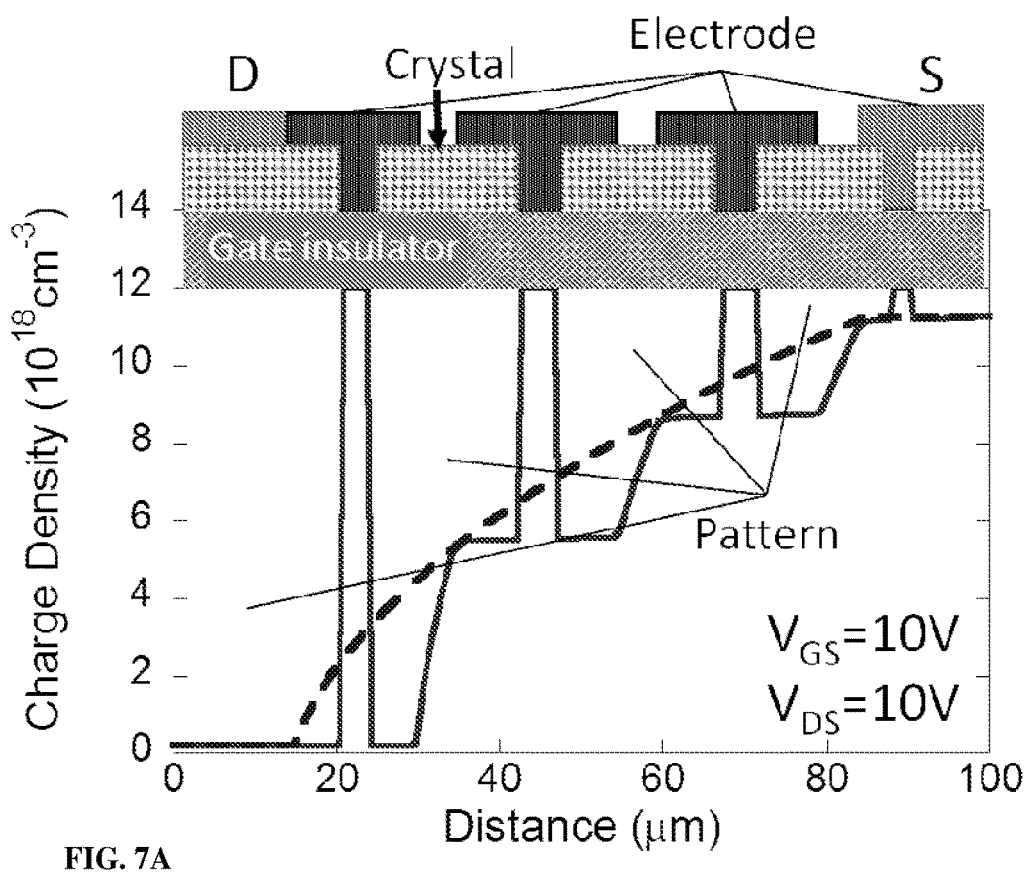
FIGS. 7A to 7C show the results of a 2D drift-diffusion-Poisson simulation of the SFET structure of FIG. 1D under specific electrical conditions, where
Figure 7B:
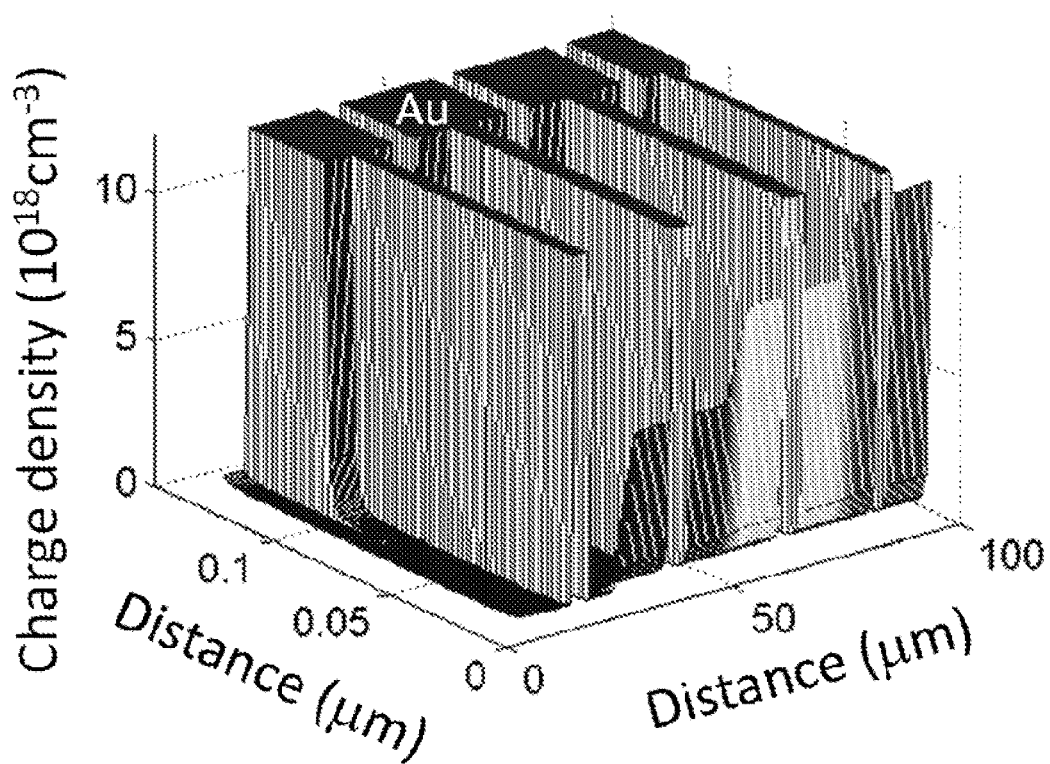
Figure 7C:
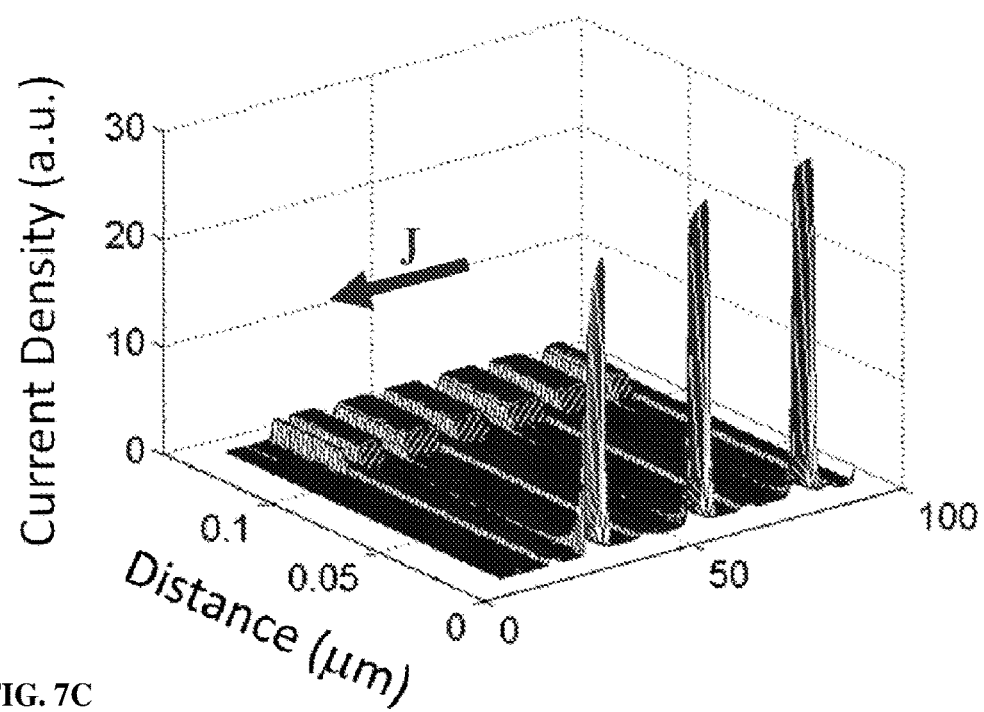

FIG. 7A shows the charge density at the transistor channel (insulator interface), together with a schematic layout of the gate insulator, on top of which there are 5 crystals partially covered by 4 metallic islands (conducting pattern). The regions in said layout parts where the conductor is touching the insulator interface correspond to parts where density goes to "infinity", and the regions where the conductor is covering the crystal correspond to the parts where the charge density is constant. FIG. 7B shows the 2D charge density distributions; the view is from the gate insulator towards the top surface showing 4 metallic islands marked by their high charge density and the charge density profile at the channel shown as a thin sheet close to zero (insulator interface). FIG. 7C shows the 2D distribution of the current flowing parallel to the insulator film between the source and drain electrodes. The current flows in the channel only in regions that are not covered by metal, where it flows through the metal: in regions where there is no metal the current is confined to the channel and shows a high density; in the regions covered by the conducting pattern the current flows through the metal and its density scales with the area occupied by the metal at each cross section along the imaginary line connecting the source and drain.

Thus, the invention provides a new kind of transistor structure formed by multiple transistors based on randomly distributed semiconductor particles, e.g. single crystals. Such a structure can be easily fabricated using stencils mask patterns. The inventors have fabricated exemplary examples of the SFET structure using both n- and p-type single crystals grown on silicon oxide substrates, by first carefully designing the molecules and then finding the right temperature for growth. The inventors have shown that this technique does not require aligned single crystal or tedious lifting or pattering process in order to get a single crystal device. Additionally, any random distribution of crystals (organic or inorganic) can be used to prepare single crystallite based transistors which are similar in nature as the single crystal transistors. Moreover, such a structure of single crystallite based transistors advantageously provides for eliminating cross talk between adjacent devices since there is no connection between individual crystals (unlike the thin film transistors). The relatively easy preparation of single crystallite transistors of the invention also allows to easily fabricate an inverter based on one n-type and one p-type single OSCTs which can be used in industrial applications with low fabrication cost.

The invention claimed is:

1. A transistor device comprising: a channel region in contact with a gate insulator and source and drain electrodes being in contact with the channel region and arranged in a spaced-apart relationship, wherein the channel region is configured with discontinuity in a material path between the source and drain electrodes, the channel region being formed by a plurality of irregularly distributed discrete semiconducting particles and a plurality of electrically conducting particles connecting at least some of said semiconducting particles to one another to provide continuous electric coupling between said at least some semiconductor particles; wherein a majority of said semiconductor particles have length to width ratio of between 1 and 15.

2. The device of claim 1, wherein the semiconductor particles comprise p-type or n-type materials.

3. A transistor device of claim 1, wherein said semiconducting particles comprise crystallites.

4. The device of claim 3, wherein said crystallites include p-type or n-type single crystals.

5. The device of claim 1, wherein said plurality of electrically conducting particles are arranged in a predetermined pattern within the channel region.

6. The device of claim 5, wherein said predetermined pattern of the electrically conducting particles provides that a distance between two adjacent conducting particles is smaller than a typical dimension of said conducting particles.

7. The device of claim 1, wherein said plurality of semiconducting particles is distributed within the channel region such that the semiconductor particles are spaced apart from each other.

8. The device of claim 1, wherein said channel region comprises a continuous film being at least a portion of said channel and providing a continuous path for electrical conduction along at least a portion of the channel region.

9. The device of claim 1, wherein a majority of said semiconductor particles have length of 5-15 μm and width of 1-15 μm.

10. The device of claim 1, wherein a majority of said electrically conducting particles have typical dimension of between 10 μm and 30 μm.

11. The device of claim 10, wherein said electrically conducting particles being arranged with distances of between 3 μm and 8 μm between them.

12. The device of claim 1, wherein material composition of the electrically conducting particles is selected to form Ohmic contact.

13. A field effect transistor device comprising a bottom gate top electrode transistor structure, wherein a material path between source and drain electrodes is discontinuous, a region between the source and drain electrodes being formed by a plurality of randomly distributed discrete crystallites and a plurality of electrically conducting particles connecting at least some of the crystallites to provide continuous electric coupling between said at least some semiconductor particles; wherein a majority of said crystallites have length of 5-15 μm and width of 1-15 μm.

14. The device of claim 13, wherein said crystallites include p-type or n-type single crystals.

15. The device of claim 13, wherein a majority of said electrically conducting particles have a size of 10-30 μm and a gap between them of 3-8 μm.

16. The device of claim 13, wherein material composition of the electrically conducting particles is selected to form ohmic contact.

17. The device of claim 16, wherein said material composition is selected to at least partially, dedope a semiconducting material of the semiconducting particles.

18. The device of claim 16, wherein said material composition is selected to at least partially dope a semiconducting material of the semiconducting particles.

19. A method for fabricating a transistor device, the method comprising:

providing a dielectric layer structure on top of a gate electrode;

forming on top of said dielectric layer structure the following: source and drain electrodes located with a distance between them, providing a plurality of discrete semiconducting particles irregularly distributed between the source and drain electrodes, and a plurality of electrically conducting particles between the source and drain electrodes forming a conducting pattern connecting at least some of the semiconducting particles to one another to thereby provide continuous electric coupling between said at least some semiconductor particles; wherein said providing irregularly distributed plurality of discrete semiconducting particles comprises spin coating using a solution comprising the semiconducting particles thereby forming a film, and annealing the spin coated film at annealing temperature close to a melting point of the film.

20. The method of claim 19, wherein said semiconducting particles comprise crystallites.

21. The method of claim 19, wherein the formation of said source and drain electrodes, the plurality of discrete semiconducting particles, and the plurality of electrically conducting particles is sequentially performed, in any order of sequential steps.

22. The method of claim 19, wherein the formation of the source and drain electrodes comprises evaporation of source and drain materials using a metal stencil mask having feature dimensions larger than corresponding dimensions of the semiconducting particles.

23. The method of claim 19, wherein the electrically conducting particles are deposited on top of said dielectric layer in a predetermined pattern.

24. The method of claim 19, the electrically conducting particles are deposited by evaporation through a stencil mask.

* * * * *